(12) United States Patent
de Raad

(10) Patent No.: US 10,978,444 B2
(45) Date of Patent: Apr. 13, 2021

(54) RC-TRIGGERED BRACING CIRCUIT

(71) Applicant: NXP B.V., Eindhoven (NL)

(72) Inventor: Gijs Jan de Raad, Bemmel (NL)

(73) Assignee: NXP B.V., Eindhoven (NL)

( * ) Notice: Subject to any disclaimer, the term of this patent is extended or adjusted under 35 U.S.C. 154(b) by 266 days.

(21) Appl. No.: 16/135,075

(22) Filed: Sep. 19, 2018

(65) Prior Publication Data

US 2020/0091136 A1 Mar. 19, 2020

(51) Int. Cl.
*H01L 27/02* (2006.01)
*H02H 9/04* (2006.01)

(52) U.S. Cl.
CPC ......... *H01L 27/0259* (2013.01); *H02H 9/046* (2013.01)

(58) Field of Classification Search
CPC . H01L 27/02; H01L 27/0248; H01L 27/0259; H01L 27/0262; H01L 27/0285; H02H 9/04; H02H 9/041; H02H 9/043; H02H 9/046; H02H 9/049
See application file for complete search history.

(56) References Cited

U.S. PATENT DOCUMENTS

| | | | |
|---|---|---|---|
| 6,442,008 B1 | 8/2002 | Anderson | |
| 6,671,153 B1 | 12/2003 | Ker et al. | |
| 8,786,990 B2 | 7/2014 | Prabhu et al. | |
| 9,214,806 B1 | 12/2015 | Huang | |
| 9,742,511 B2 | 8/2017 | Blesser | |
| 2008/0316660 A1 | 12/2008 | Huang et al. | |
| 2011/0063762 A1 | 3/2011 | Lee et al. | |
| 2012/0008243 A1 | 1/2012 | Huitsing et al. | |
| 2013/0163129 A1* | 6/2013 | Lai | H02H 9/046 361/56 |
| 2017/0117267 A1* | 4/2017 | De Raad | H01L 29/1095 |
| 2017/0155243 A1* | 6/2017 | Tan | H02H 9/046 |
| 2018/0331090 A1* | 11/2018 | de Raad | H02H 9/046 |

FOREIGN PATENT DOCUMENTS

| | | | | |
|---|---|---|---|---|
| CN | 103795026 B | 8/2016 | | |
| EP | 3116026 A1 * | 1/2017 | ......... | H01L 29/7436 |
| NL | 2008102285 * | 8/2008 | ............. | H01L 27/02 |

* cited by examiner

*Primary Examiner* — Matthew V Nguyen

(57) ABSTRACT

A protection circuit including a low-leakage electrostatic discharge (ESD) protection circuit and at least one bracing circuit, the at least one bracing circuit including an RC input stage connected between a pad and ground, a driver transistor configured to drive a plurality of components of the at least one bracing circuit, a series transistor on an input line configured to act as a high impedance element during an ESD event, and a mini-clamp configured to short the input line to ground to protect a circuit to be protected during an ESD event.

18 Claims, 5 Drawing Sheets

RC-TRIGGERED BRACING CIRCUIT

TECHNICAL FIELD

Various exemplary embodiments disclosed herein relate to electrostatic discharge (ESD) protection, and more particularly to a bracing circuit used in combination with low-leakage ESD protection schemes.

BACKGROUND

State of the art ESD protection for low voltage circuits (typically 5V and lower) may include a capacitively triggered railclamp in combination with ESD diodes. While the railclamp remains a workhorse for contemporary ESD circuits, drawbacks include a significant stand-by leakage. In integrated circuits (ICs) designed for low-leakage applications, high leakage is unacceptable. With advancing silicon technology this problem tends to get worse as gate lengths decrease. Moving to smaller dimensions, stand-by leakage for CMOS components such as NMOS transistors increases.

One alternative to using a railclamp for ESD protection is to use a grounded gate NMOS transistor (GGNMOS transistor), or a Low Trigger Voltage Silicon Controlled Rectifier (LVTSCR), as ESD protection devices. Both devices have a much smaller device width compared to a railclamp and therefore have a far lower stand-by leakage current. GGNMOS transistor and LVTSCR's, however, have a drawback of their own. As they sink the ESD PAD input current, they operate at a higher clamp voltage than railclamps. This increased clamp voltage during an ESD pulse puts a higher voltage stress on a circuit being protected. The increased voltage stress that comes with using a GGNMOS transistor is enough to risk damaging the circuit being protected.

SUMMARY

A brief summary of various embodiments is presented below. Some simplifications and omissions may be made in the following summary, which is intended to highlight and introduce some aspects of the various embodiments, but not to limit the scope of the invention. Detailed descriptions of embodiments adequate to allow those of ordinary skill in the art to make and use the inventive concepts will follow in later sections.

Embodiments include a protection circuit including a low-leakage electrostatic discharge (ESD) protection circuit and at least one bracing circuit, the at least one bracing circuit including an RC input stage connected between a pad and ground, a driver transistor configured to drive a plurality of components of the at least one bracing circuit, a series transistor on an input line configured to act as a high impedance element during an ESD event, and a mini-clamp configured to short the input line to ground to protect a circuit to be protected during an ESD event.

A source of the series transistor may be connected to the pad and the drain of the series transistor is connected to a circuit to be protected.

A source of the driver transistor may be connected to the pad and the drain of the driver transistor is connected to a gate of the mini-clamp.

The series transistor may be a large size transistor. The series transistor may be a PMOS transistor.

The mini-clamp may be a small size transistor. The mini-clamp may be an NMOS transistor.

During an ESD event, the source of the series transistor and the gate of the series transistor may have substantially the same potential.

The RC input stage may include a capacitor connected transistor.

The low leakage ESD protection circuit may include a grounded gate NMOS transistor to sink ESD pad current to ground.

The protection circuit may include a second bracing circuit in parallel with the at least one bracing circuit.

Embodiments may also include an ESD protection circuit, including a low-leakage electrostatic discharge (ESD) protection circuit and a bracing circuit, the bracing circuit including an extended drain (ED) transistor connected to the low-leakage ESD protection circuit and a pad, an RC input stage connected between the extended drain transistor and ground, a driver transistor configured to drive a plurality of components of the bracing circuit, a mini-clamp configured to short the input line to ground to protect a circuit to be protected during an ESD event, and a gate clamp configured to pull down on a gate of the ED transistor to configure it in a high impedance state.

The mini-clamp and gate clamp transistors may be NMOS transistors.

Embodiments may also include a method of protecting a circuit from an ESD pulse using a bracing circuit, including sinking an ESD current pulse using a low-leakage ESD protection device, activating an RC trigger circuit using an operating voltage of the low-leakage protection device, triggering a driver transistor to activate elements of the bracing circuit, activating a series transistor to a high impedance state, and turning on a mini-clamp transistor to connect an input line to ground and protect the circuit to be protected.

The method may include activating the series transistor and turning on the mini-clamp at substantially the same time.

BRIEF DESCRIPTION OF THE DRAWINGS

Additional objects and features of the invention will be more readily apparent from the following detailed description and appended claims when taken in conjunction with the drawings. Although several embodiments are illustrated and described, like reference numerals identify like parts in each of the figures, in which:

DETAILED DESCRIPTION

Figure 1A:
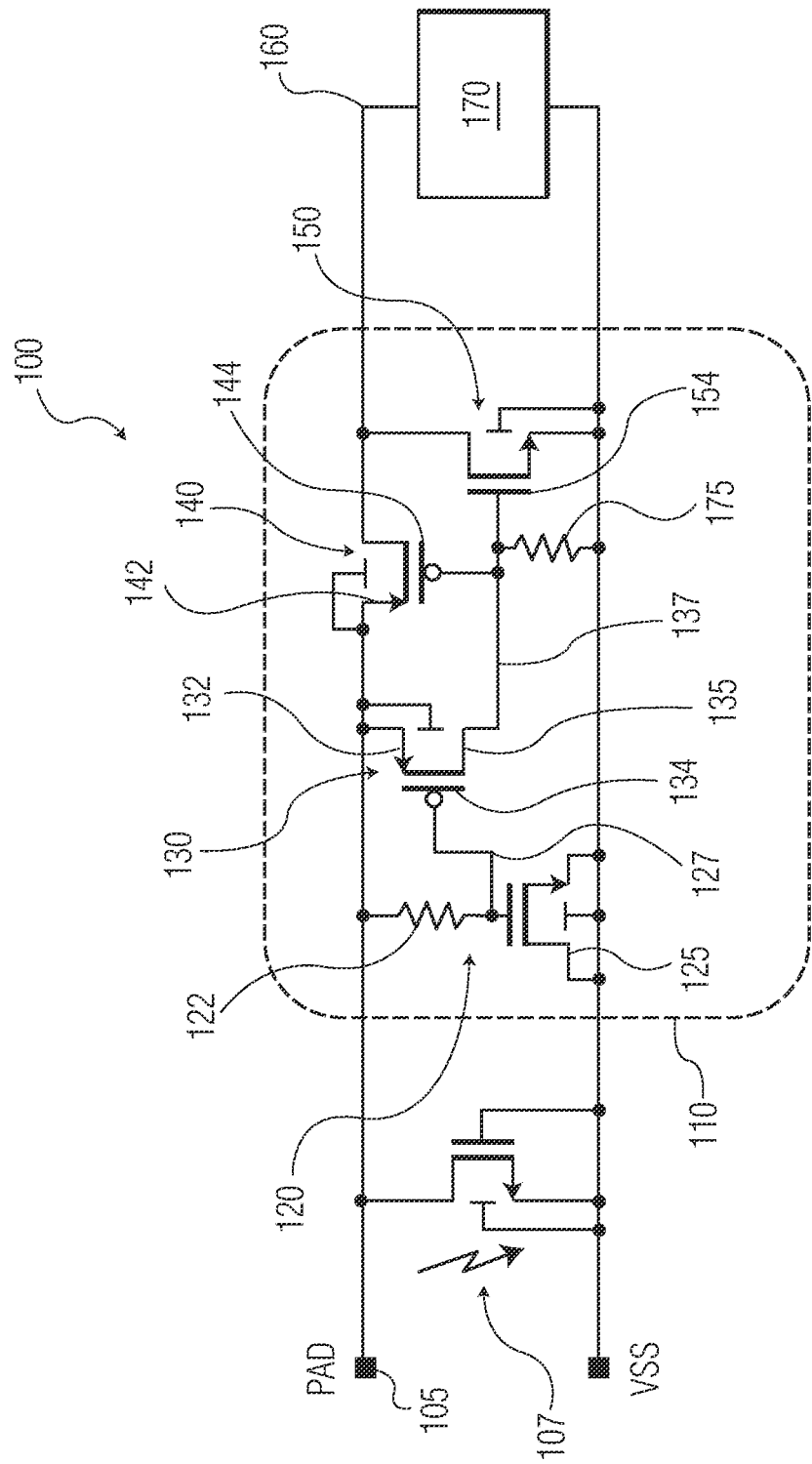
FIG. 1A illustrates a protection circuit in accordance with embodiments described herein.

It should be understood that the figures are merely schematic and are not drawn to scale. It should also be understood that the same reference numerals are used throughout the figures to indicate the same or similar parts.

The descriptions and drawings illustrate the principles of various example embodiments. It will thus be appreciated that those skilled in the art will be able to devise various arrangements that, although not explicitly described or shown herein, embody the principles of the invention and are included within its scope. Furthermore, all examples recited herein are principally intended expressly to be for pedagogical purposes to aid the reader in understanding the principles of the invention and the concepts contributed by the inventor(s) to furthering the art, and are to be construed as being without limitation to such specifically recited examples and conditions. Additionally, the term, "or," as used herein, refers to a non-exclusive or (i.e., and/or), unless otherwise indicated (e.g., "or else" or "or in the alternative"). Also, the various embodiments described herein are not necessarily mutually exclusive, as some embodiments can be combined with one or more other embodiments to form new embodiments. Descriptors such as "first," "second," "third," etc., are not meant to limit the order of elements discussed, are used to distinguish one element from the next, and are generally interchangeable. Values such as maximum or minimum may be predetermined and set to different values based on the application.

Embodiments described herein include an RC-triggered circuit that, as an ESD pulse strikes, disconnects sensitive circuit blocks from a PAD under stress and temporarily shorts them to an IC ground. As described herein, embodiments allow use of a small NMOS transistor, or "miniclamp" as a part of a bracing circuit and low-leakage ESD protection device for circuit blocks that would normally not survive the higher clamp voltage of a GGNMOS transistor. The term "bracing circuit" may refer to the RC-triggered circuit having the circuit being protected "brace" itself for an oncoming ESD pulse and a high clamping voltage that occurs as the GGNMOS transistor sinks the ESD pulse.

Table I illustrates typical device width and length (W/L) values and operating voltages for devices such as a capacitive railclamp and GGNMOS transistor designed to protect against a 2-ampere current pulse, which can be a 3-kV human body model (HBM) equivalent. Stand-by leakage of an ESD protection circuit in general depends on the processing technology, and generally the stand-by leakage of a device scales linearly with the W/L ratio. A GGNMOS transistor, therefore, leaks about 20 times less than a railclamp. As denoted, a GGNMOS transistor may have a smaller size in terms of gate length and width, utilizes much less stand-by leakage current, but can have a higher voltage during and after triggering.

TABLE I

| ESD Current: 2 A (equivalent to 3 kV | Typical W/L (μm/μm) | Operation voltage during an ESD event | Expected stand-by leakage (at 5 V, 125 deg C.) |
|---|---|---|---|
| Railclamp: | 4200/0.6 | ~5 V | 560 nA |
| GGNMOS TRANSISTOR | 200/0.6 | ~10 V during triggering ~7 V after triggering | 28 nA |

FIG. 1A illustrates a protection circuit 100 configured to protect a circuit 170 in accordance with embodiments described herein. The protection circuit 100 may be designed as part of an ESD protection scheme, or added to an existing ESD or other circuit that exhibits high voltage at an input node.

A GGNMOS transistor 107 uses very little stand-by leakage current when not activated. During an ESD event, the GGNMOS transistor 107 is designed to turn on and sink the current pulse appearing at a PAD 105 to VSS. However, as indicated in Table I, when the GGNMOS transistor is in operation, the voltage at the node connected to the PAD 105 remains high, on the order of 10 V during triggering and 7 V after triggering. If not dealt with, this voltage can damage the circuit to be protected 170. A bracing circuit 110 according to embodiments described herein may be used to minimize the high voltage that remains unaccounted for by the operation of the GGNMOS transistor 107.

The protection circuit 100 may be configured to handle ESD pulses that arise from a human body. ESD pulses may also be put on an IC during qualification tests before sale. The protection circuit 100 may receive an initial ESD pulse at the PAD 105. The pulse may initially be routed to the GGNMOS transistor 107 for ESD protection, but as described above, the GGNMOS transistor 107 has a high operating voltage during the ESD event. To negate damage to the circuit 170 to be protected, the bracing circuit 110 may be used.

The bracing circuit 110 may include an RC input stage 120 and a driver PMOS transistor 130. The RC input stage 120 includes a resistor 122 in series with an NMOS transistor 125 that is configured as a capacitor wherein the source, drain, and body of the NMOS transistor 125 are connected to VSS. The resistor 122 is connected to the gate of the capacitor-connected NMOS transistor 125 at what may be designated a midpoint 127 of the RC input stage 120.

During normal operation, the voltage at PAD 105 is constant and supplies the protected circuit 170 with an operation voltage. In general, this operation voltage is well-controlled to remain below a pre-set limit so as to ensure that there is no risk of damaging the protected circuit 170. When the protected circuit 170 is not operated, the voltage at PAD 105 is also constant, and equals zero volts with respect to the circuit VSS PAD 105. In either case, there is no current in the resistor 122, and the potentials at PAD 105 and RC midpoint 127 are equal. This indicates that the RC input stage 120 is not activated. The GGNMOS transistor 107 also remains off.

During an ESD event, operation of the GGNMOS transistor 107 routes an ESD current pulse to VSS. This involves a rapid increase of the voltage at PAD 105 from either zero volts, or from the intended operating voltage, to the voltage during triggering of the GGNMOS transistor 107 (10V in Table I) during initial stages of the ESD pulse. After that, the voltage at the PAD 105 decreases somewhat (to 7V in Table I) and then stays stable for the remainder of the ESD pulse. Both of these two voltages are higher than the intended operating voltage of the protected circuit 170, and both have the potential to damage the protected circuit 170. The rapid increase of the voltage at PAD 105 results in an electrical current flowing through the resistor 122, and, by consequence, in the potential of PAD 105 being higher than that of the RC midpoint 127. This indicates that the RC input stage 120 is activated. A property of the RC input stage 120 is that the voltage of the RC midpoint 127 remains constant over a time-interval that is determined by the mathematical product of the resistance value of the resistor 122, and the capacitance value realized by the NMOS transistor 125. These two values are deliberately chosen such that the resulting time-interval is far longer than the expected duration of an ESD pulse. This means that over the entire expected duration of the ESD pulse, the RC input stage 120 will remain active, and this active state involves a voltage on the RC midpoint 127 that is lower than the voltage on PAD 105.

The RC midpoint 127 of the RC input stage 120 connects to a gate of a driver PMOS transistor 130. The driver PMOS transistor 130 drives the action of the remainder of the bracing circuit 110. A source 132 of the driver PMOS transistor 130 is connected to the input PAD 105. During normal operation, the potentials of a gate 134 of the driver PMOS transistor 130, and of a source 132 of the same driver PMOS transistor 130 will be at supply voltage. Because there is no potential difference, the driver PMOS transistor 130 is thus in a non-conductive state, and a pull-down resistor 175 ensures that the voltage on the driver output node 137 is low (equal to VSS). As a result, the series PMOS transistor 140 is conductive which allows the protected circuit 170 to be supplied, and the NMOS transistor mini-clamp 150 is non-conductive.

During an ESD event at the PAD 105, the voltage at the RC midpoint 127 may rise slightly, but will remain significantly lower than the voltage observed at PAD 105, because of the resistor 122. The turn-on duration of the protection circuit 100 may be controlled by the RC time constant of the RC input stage 120. The RC time constant may be designed large enough, about several hundreds nanoseconds, to keep the bracing circuit 110 in an "ON" state under the ESD stress condition. The RC input stage 120 may be called a trigger circuit for the ability to trigger the driver PMOS transistor 130 and subsequent circuitry.

During the ESD event, voltage on the PAD-node 105 rises quickly. The source 132 of the driver PMOS transistor 130 and a source 142 of series PMOS transistor 140 both follow this fast rise in potential as they are connected directly to the PAD 105. With a high voltage present at the source 132 and a low voltage at the gate 134, the negative gate 134 to source 132 voltage is increased, opening a PMOS channel further to allow more current to flow through the driver PMOS transistor 130. This establishes a higher voltage at the driver output node 137. This higher voltage is sufficient to turn on the NMOS transistor mini clamp 150. The driver output node 137 of the driver PMOS transistor 130 connects to a gate of a series PMOS transistor 140 and to a gate of an NMOS transistor mini-clamp 150. When the high voltage becomes present at the drain 135 of the driver transistor and on the driver output node 137, the driver PMOS transistor 130 activates the series PMOS transistor 140 and turns on the NMOS transistor mini-clamp 150 at substantially the same time.

During the ESD event, the driver output node 137 has a high potential which is input to the gate 144 of the series PMOS transistor 140. The source 142 of the series PMOS transistor may also have the high potential of PAD. The high voltage at the source 142 and at the gate 144 forces a very small gate-source bias on the series PMOS transistor 140, such that the series PMOS transistor 140 becomes highly resistive and non-conductive. At the same time, the higher voltage at the driver output node 137 turns on the gate 154 of the NMOS transistor "mini-clamp" 150 which shorts a node 160 to be protected to VSS. In this way, the protected circuit 170 is protected from high voltage that occurs on PAD 105 during ESD event. When the gate 154 is turned on, any residual operating voltages on the input line 111 are shorted to ground and a ground path is created for any ESD current or GGNMOS voltage that gets through the high impedant series PMOS transistor 140.

Figure 1B:
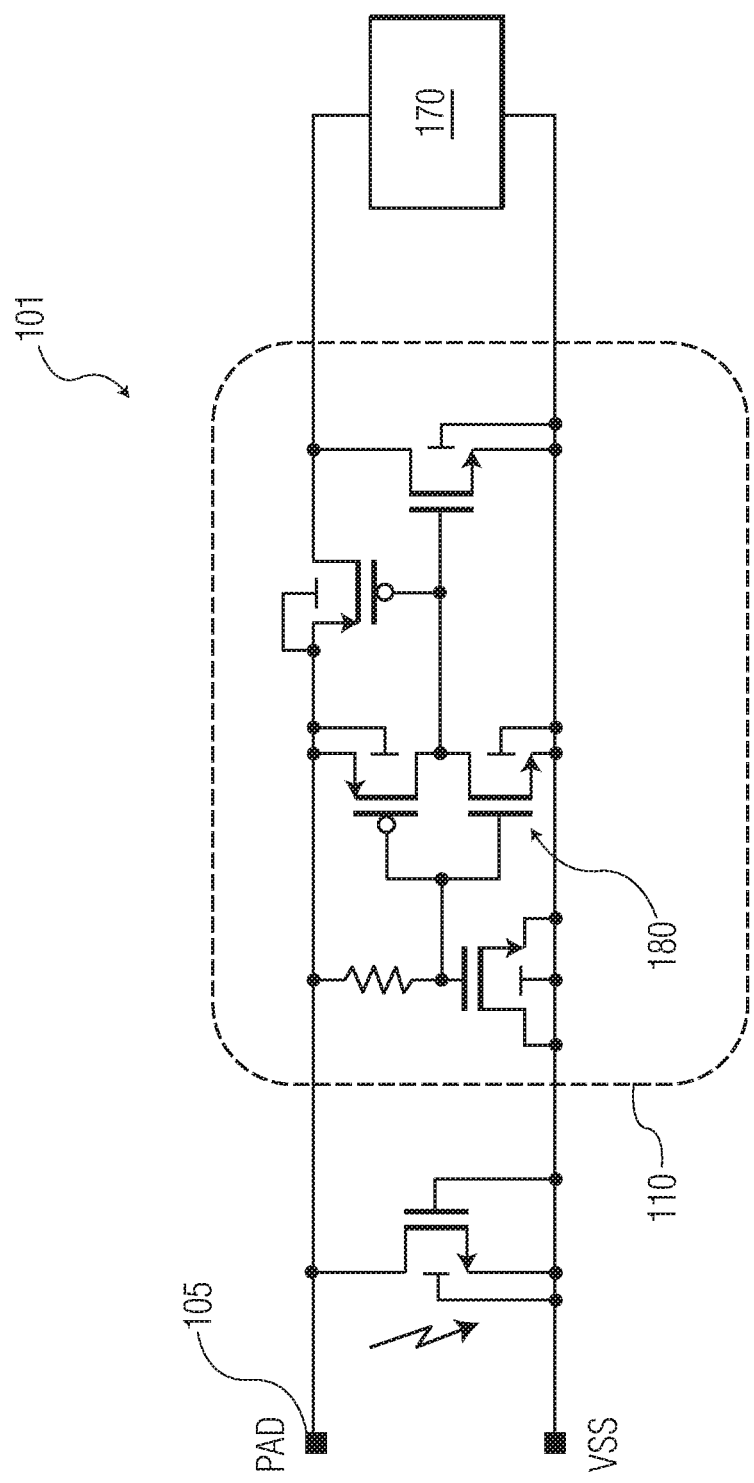
FIG. 1B illustrates a variation of the protection circuit in accordance with FIG. 1A.

FIG. 1B illustrates a variation of the protection circuit in accordance with FIG. 1A. In FIG. 1B, a pull-down NMOS transistor 180 may replace the pull-down resistor 175 of FIG. 1A. The pull-down resistor 175 may be replaced by the pull-down NMOS transistor 180 to suppress DC leakage through the trigger circuit further.

In the bracing circuit 110, the series PMOS transistor 140 and NMOS transistor mini-clamp 150 may be driven simultaneously during an ESD event. Because of the small gate-source voltage difference, the series PMOS transistor 140 is driven to a high impedance state during ESD and this high impedance greatly limits the current to be sunk by the NMOS transistor mini-clamp 150. Because of this design, the size of the NMOS transistor mini-clamp 150 can be kept very small, such as on the order of 20 μm gate width. A "small" mini-clamp may be on the order of 20 to 50 μm, and include a single gate, or a few parallel gates that are 10 μm each. Thus the bracing circuit 110 may be an enabler for robust ESD, low standby leakage current, products. The dimension of the series PMOS transistor 140 may be chosen as a function of the maximum amount of series resistance that the circuit can tolerate in its supply line, and can be much larger, such as 1,000 μm. The large size includes a gate of about 1,000 μm wide, divided up in, for example, twenty parallel gates of 50 μm each. A size of a total gate width is a sum of the widths of all parallel gates. Channel leakage in the series PMOS transistor 140 feeds from the PAD 105 into the protected circuit 170, and therefore does not increase the stand-by leakage observed at the PAD 105.

Figure 2:
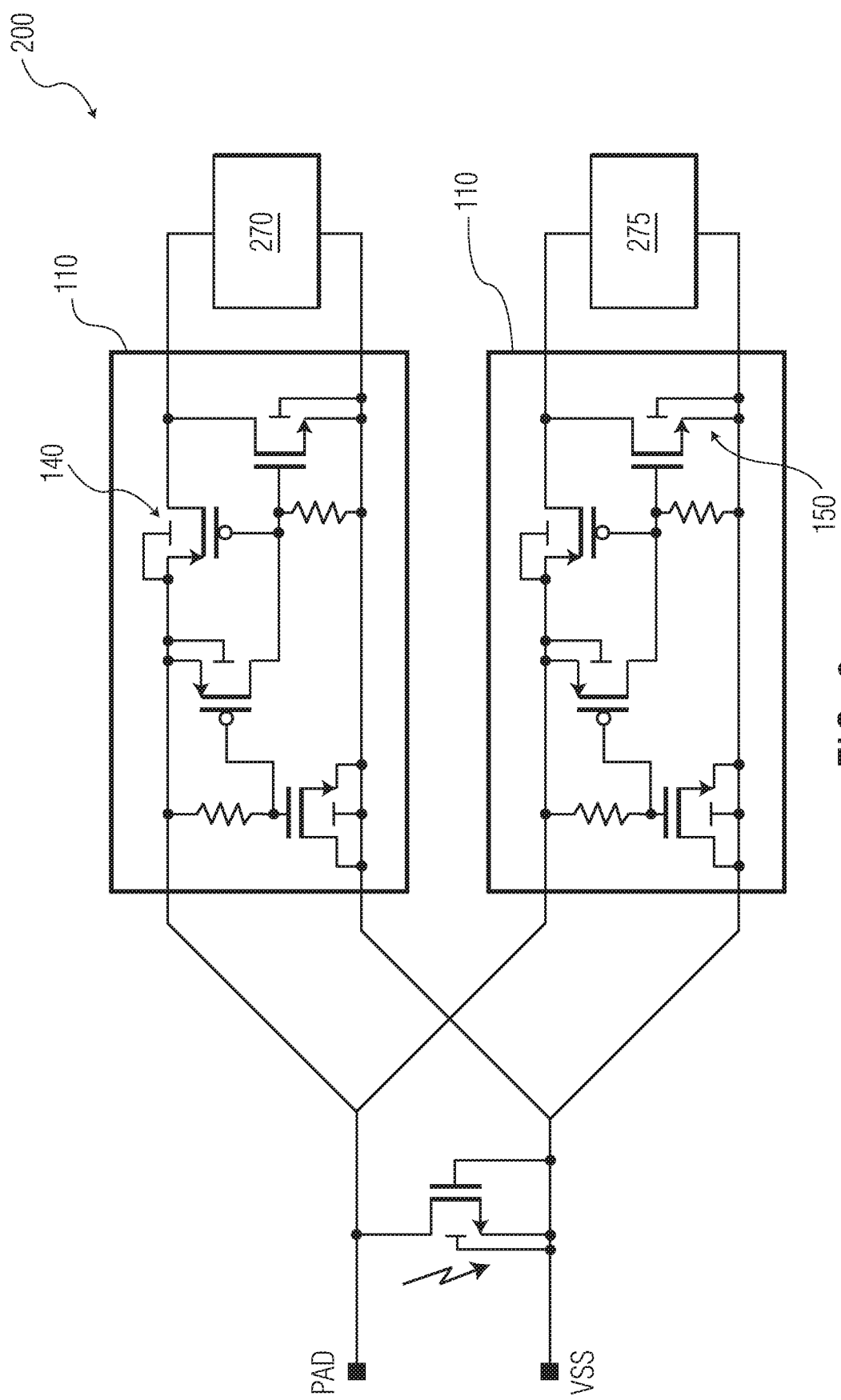
FIG. 2 illustrates a parallel arrangement of the protection circuit in accordance with FIGS. 1A and 1B.

FIG. 2 illustrates a parallel arrangement 200 of bracing circuits 110 in accordance with FIGS. 1A and 1B. The parallel bracing circuit 200 may reduce series resistance presented by the series PMOS transistor 140, at the expense of slightly increased supply leakage caused by the increased total number of NMOS transistor mini-clamps 150, one in each bracing circuit.

Embodiments could implement these separate bracing circuits for the different circuits 270 and 275 to be protected, as a way of reducing the overall series resistance presented by the series PMOS transistors 140. This will increase stand-by leakage because each additional bracing circuit has an NMOS transistor mini-clamp 150 which adds to the leakage current of the part. Embodiments may balance the maximum allowable leakage against the maximum allowable supply line series resistance.

Figure 3:
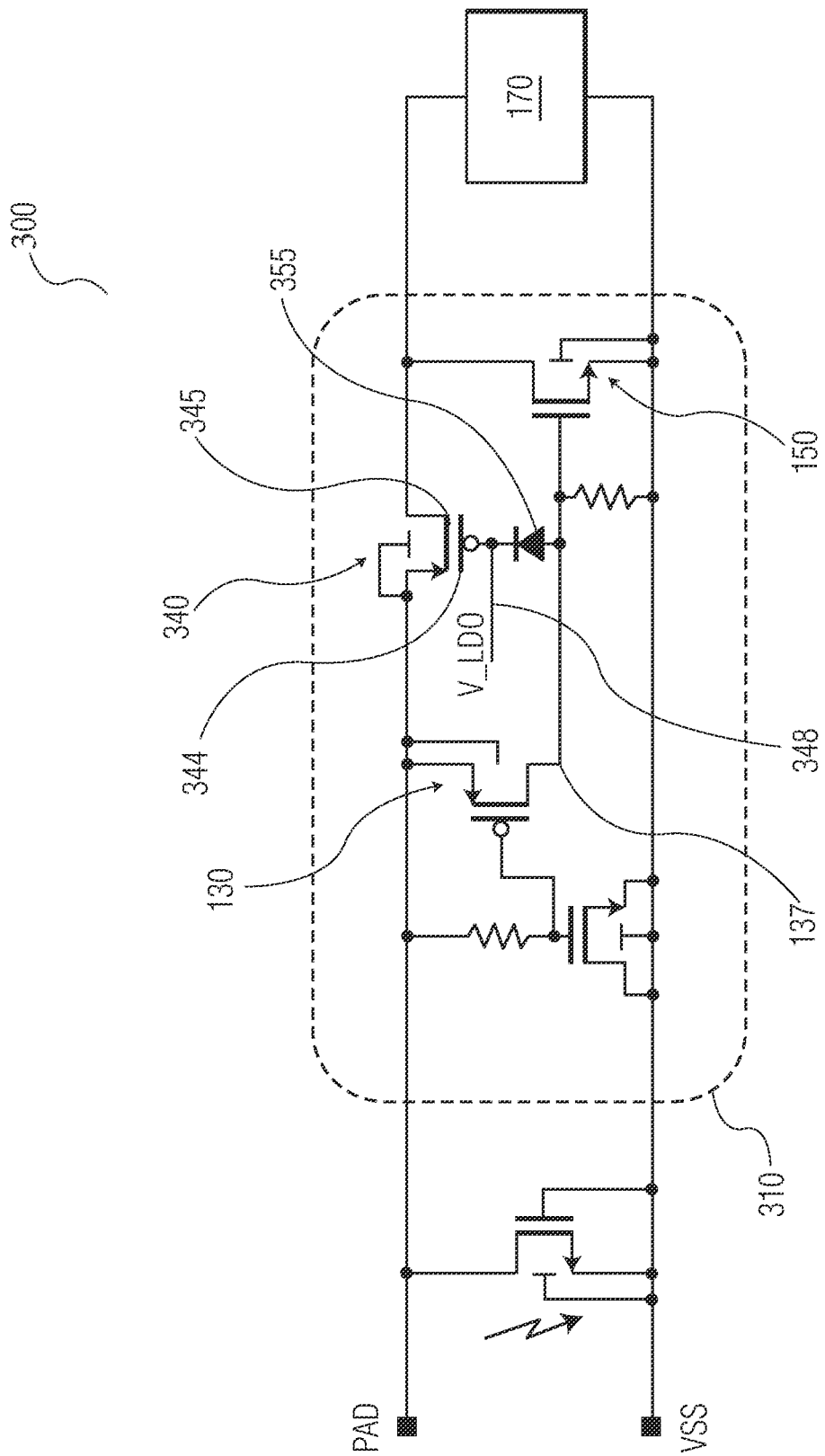
FIG. 3 illustrates a variation of a protection circuit in accordance with embodiments described herein.

FIG. 3 illustrates a variation of a protection circuit 300 in accordance with embodiments described herein. A second variant is the integration of a bracing circuit 310 into a pre-existing low drop out (LDO) voltage regulator 340 including a PMOS transistor 345 and a diode 355. In this case, the LDO 340 may be a circuit pre-existent in combination with a circuit 170 to be protected. By combining the bracing circuit 310 with an LDO 340, the LDO 340 may be used in place of the series PMOS transistor 140 illustrated in FIGS. 1A and 1B. This re-use of the LDO regulator 340 reduces an added silicon footprint of the bracing circuit 310 because the series PMOS transistor 345 may be the largest device in the circuit. Re-using the PMOS transistor-LDO 340 as a series PMOS transistor in the bracing circuit 310 may also allow the bracing circuit 310 to be added without introducing additional series resistance in the signal or supply line.

In operation, the driver PMOS transistor 130 drives a gate 344 of the PMOS transistor-LDO 340 via the series diode 355. At the same time, a voltage V_LDO 348 drives the gate 344 of the PMOS transistor-LDO 340 directly during normal operation. During ESD, the voltage on driver output node 137 is driven high (equal voltage as PAD), and the voltage on the PMOS transistor-LDO gate 344 follows by one diode voltage drop. As a result, the gate-source bias on the PMOS transistor-LDO 340 is limited to −0.6 V during ESD which may put the PMOS transistor-LDO 340 in a high impedant state. Again, the ability to configure the PMOS transistor-LDO 340 in a high-impedant state allows the use of the very small size NMOS transistor mini-clamp 150 as internal ESD protection, and that makes this variant to the bracing circuit 310 compatible with high to extreme requirements on low stand-by leakage currents. The bracing circuit 310 may also be arranged in a parallel configuration with another bracing circuit 310 in a manner as illustrated in FIG. 2.

Figure 4:
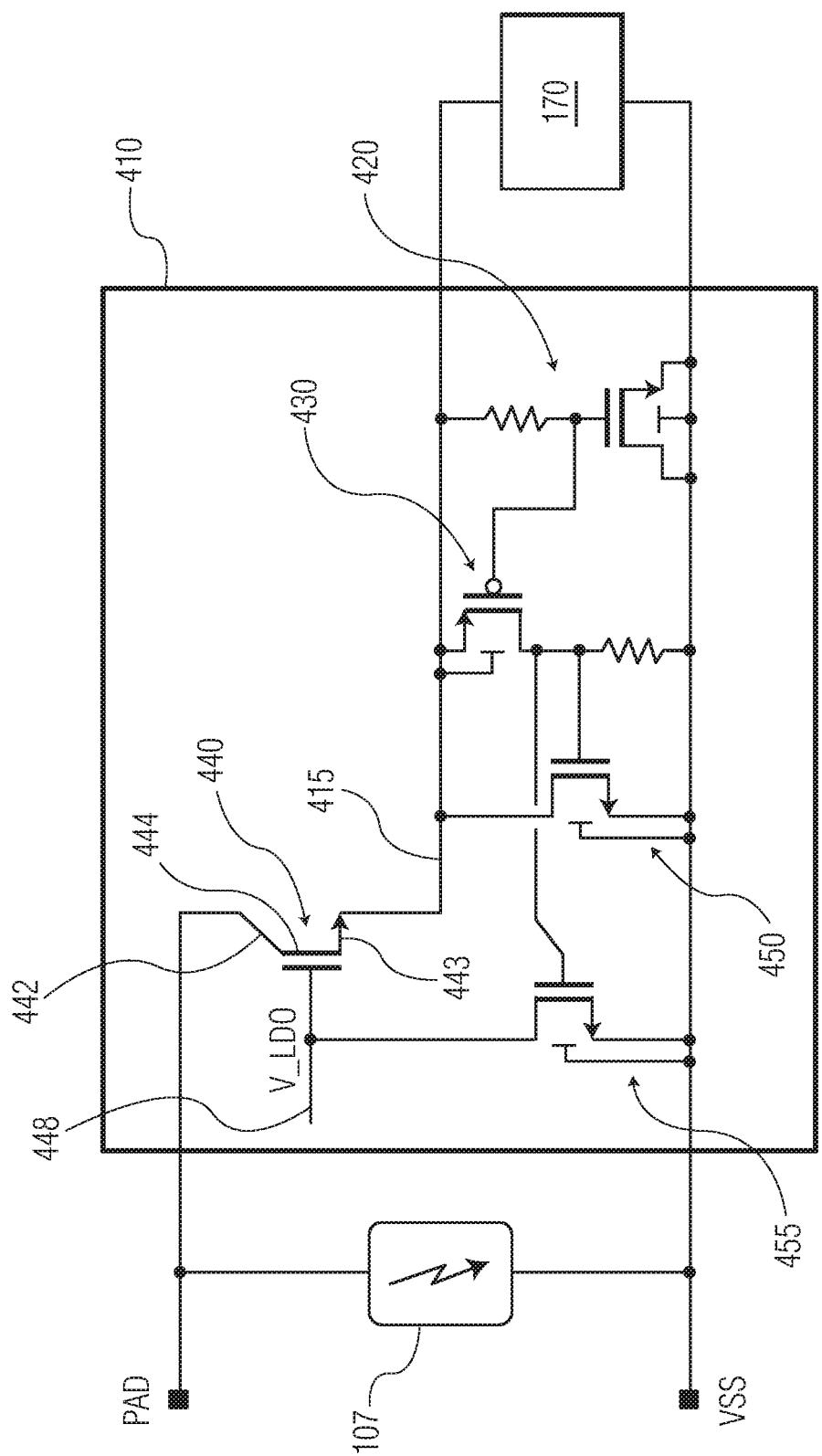
FIG. 4 illustrates a bracing circuit combined with a high-voltage LDO EDNMOS transistor configured as source follower in accordance with embodiments described herein.

FIG. 4 illustrates a bracing circuit 410 that is combined with an existing circuit such as an LDO 440. In this example, the LDO 440 may be an extended drain (EDNMOS) transistor configured as a source follower. An extended drain 442 may encompass a larger area and/or depth than a standard drain region. The extended drain region may thus be configured to receive and tolerate increased PAD voltages without ruining the LDO 440. The LDO 440 may be driven by V_LDO 448 during normal operation.

During an ESD event, the extended drain 442 receives the bulk of the high voltage. Part of the ESD current ripples through the LDO source follower 440 and activates the RC-stage 420 of the bracing circuit 410. The RC stage 420 may drive two NMOS transistors (via the driver PMOS transistor 430). An NMOS mini-clamp 450 is driven by PMOS driver transistor 430. The NMOS mini-clamp 450 is configured to pull down the power line 415 to VSS and protect the circuit 170 directly. A second NMOS transistor "gate clamp" 455 is activated by the driver PMOS transistor 430 and pulls down on the gate 444 of the ED-NMOS transistor LDO 440, putting it in a high impedance state. That state is reached because the V_LDO signal can be configured to have substantially the same, or lower, potential as the potential observed on the power line 415 that connects to a source terminal 443 of the ED-NMOS transistor LDO 440. The high impedance state places the ED-NMOS transistor LDO 440 in a non-conductive state, to further protect the circuit 170. Because the ED-NMOS transistor LDO 440 is put in a high impedance state and is non-conductive, both the gate clamp 455 and mini-clamp 450 NMOS transistors can be kept small, and thus, compatible with low leakage requirement. The bracing circuit 410 may also be arranged in a parallel configuration with another bracing circuit 410 in a manner as illustrated in FIG. 2.

Embodiments may optimize ESD design for low stand-by leakage by minimizing the leakage current in a primary protection element. One way of doing that is by using a snap-back device (GGNMOS transistor or LVTSCR) as primary protection element. With the use of a snap-back device comes the desire to brace the circuit to be protected, against the higher operating voltage of a snap-back ESD protection.

The bracing circuits discussed herein may use elements including the large series PMOS and small mini-clamp NMOS that are added to existing GGNMOS and other electronic circuits, while the circuit block(s) being protected remain(s) essentially unchanged. As a result, bracing circuits described herein may be applied with minimal influence on the overall part performance and may be added at a late stage in the design process, or as a fix to an unexpected ESD issue.

A bracing circuit described herein may permit the use of a GGNMOS transistor or LVTSRC as primary ESD protection in designs that would otherwise have to be protected by a capacitive railclamp. This enables a significant reduction in stand-by leakage (about 20 times) because GGNMOS transistors and LVTSCRs in general leak far less than capacitive railclamps do.

Although the various exemplary embodiments have been described in detail with particular reference to certain exemplary aspects thereof, it should be understood that the invention is capable of other embodiments and its details are capable of modifications in various obvious respects. As is readily apparent to those skilled in the art, variations and modifications can be affected while remaining within the spirit and scope of the invention. Accordingly, the foregoing disclosure, description, and figures are for illustrative purposes only and do not in any way limit the invention, which is defined only by the claims.

The invention claimed is:

1. A bracing circuit, comprising:
   first and second input nodes;
   first and second output nodes;
   wherein the first input node is configured to be coupled to an input voltage pad and a first node of an electrostatic discharge (ESD) protection circuit;
   wherein the second input node is configured to be coupled to a ground voltage pad and a second node of the electrostatic discharge (ESD) protection circuit;
   wherein the first output node is configured to be coupled to a first node of a circuit to be protected;
   wherein the second output node is configured to be coupled to a second node of the circuit to be protected;
   an RC input stage connected between the first and second input nodes;
   wherein the RC input stage is configured to generate a trigger signal in response to an ESD event between the first and second input nodes;
   a driver transistor coupled to receive the trigger signal from the RC input stage and in response set a series transistor to a high-impedance state and set a mini-clamp transistor to a low-impedance state;
   wherein the series transistor includes an input coupled to the first input node, and an output coupled to the first output node; and
   wherein the mini-clamp transistor includes an input coupled to the first output node, and an output coupled to the second output node.

2. The bracing circuit of claim 1, wherein a source of the series transistor is connected to the input voltage pad and the drain of the series transistor is connected to the first node of the circuit to be protected.

3. The bracing circuit of claim 1, wherein a source of the driver transistor is connected to the input voltage pad and the drain of the driver transistor is connected to a gate of the mini-clamp transistor.

4. The bracing circuit of claim 1, wherein the series transistor is a large size transistor.

5. The bracing circuit of claim 1, wherein the series transistor is a PMOS transistor.

6. The bracing circuit of claim 1, wherein the mini-clamp is a small size transistor.

7. The bracing circuit of claim 1, wherein the mini-clamp is an NMOS transistor.

8. The bracing circuit of claim 1, wherein during the ESD event, a source of the series transistor and a gate of the series transistor have substantially the same potential.

9. The bracing circuit of claim 1, wherein the RC input stage includes a capacitor connected transistor.

10. The bracing circuit of claim 1, wherein the ESD protection circuit includes a grounded gate NMOS transistor to sink current from the ESD event on the input voltage pad to the ground voltage pad.

11. The bracing circuit of claim 1, comprising a second bracing circuit in parallel with the at least one bracing circuit.

12. The bracing circuit of claim 1:
   wherein the second input node is coupled to the second output node.

13. The bracing circuit of claim 1:
wherein the series transistor is in a low-impedance state before the RC input stage receives the trigger signal.

14. The bracing circuit of claim 13:
wherein the series transistor is configured to pass a voltage on the input voltage pad to the first output node in the low-impedance state.

15. The bracing circuit of claim 1:
wherein the mini-clamp transistor is in a high-impedance state before the RC input stage receives the trigger signal.

16. The bracing circuit of claim 15:
wherein the mini-clamp transistor is configured to short the first output node to the second output node in the low-impedance state.

17. The bracing circuit of claim 15:
wherein the mini-clamp transistor is configured to short the first output node to the ground voltage pad in the low-impedance state.

18. A method of protecting a circuit from an ESD event received between an input voltage pad and a ground voltage pad using a bracing circuit, comprising:
- sinking current from the ESD event using an ESD protection device coupled between the input voltage pad and the ground voltage pad;
- triggering a driver transistor in response to the ESD event using an RC trigger circuit;
- wherein in response to the triggering, the driver transistor places a series transistor into a high impedance state and a mini-clamp transistor into a low-impedance state;
- blocking the input voltage pad from the circuit to be protected when the series transistor is in the high impedance state; and
- shorting the circuit to be protected to the ground voltage pad when the mini-clamp transistor is in the low-impedance state so as to protect the circuit to be protected from the ESD event.

* * * * *